(12) United States Patent
Smeets

(10) Patent No.: US 9,645,512 B2
(45) Date of Patent: May 9, 2017

(54) SUBSTRATE DISTORTION MEASUREMENT

(75) Inventor: Erik Marie Jose Smeets, Prinsenbeek (NL)

(73) Assignee: ASML NETHERLANDS B.V., Veldhoven (NL)

( * ) Notice: Subject to any disclaimer, the term of this patent is extended or adjusted under 35 U.S.C. 154(b) by 508 days.

(21) Appl. No.: 13/370,102

(22) Filed: Feb. 9, 2012

(65) Prior Publication Data

US 2012/0270150 A1 Oct. 25, 2012

Related U.S. Application Data

(62) Division of application No. 11/175,033, filed on Jul. 6, 2005, now Pat. No. 8,139,218.

(51) Int. Cl.
*G01B 11/00* (2006.01)
*G03F 7/20* (2006.01)

(52) U.S. Cl.
CPC ........ *G03F 7/7085* (2013.01); *G03F 7/70716* (2013.01); *G03F 7/70783* (2013.01)

(58) Field of Classification Search
CPC ............ G01N 21/9503; G03F 7/70716; G03F 7/70783; G11B 7/261; G11B 11/10582
USPC .................................. 356/339–401
See application file for complete search history.

(56) References Cited

U.S. PATENT DOCUMENTS

| | | | |
|---|---|---|---|
| 4,286,880 A | 9/1981 | Young | |
| 4,391,511 A | 7/1983 | Akiyama et al. | |
| 4,803,644 A | 2/1989 | Frazier et al. | |
| 4,828,366 A * | 5/1989 | Nelson | ............................. 349/22 |
| 5,229,589 A | 7/1993 | Schneider | |
| 5,229,872 A | 7/1993 | Mumola | |
| 5,296,891 A | 3/1994 | Vogt et al. | |
| 5,338,646 A * | 8/1994 | Nakayama et al. | ...... 430/270.11 |
| 5,523,193 A | 6/1996 | Nelson | |
| 5,717,204 A | 2/1998 | Meisburger et al. | |
| 5,973,766 A | 10/1999 | Matsuura et al. | |
| 6,063,527 A * | 5/2000 | Nishikawa et al. | .............. 430/7 |
| 6,064,486 A | 5/2000 | Chen et al. | |
| 6,297,170 B1 * | 10/2001 | Gabriel et al. | ................. 438/738 |
| 6,297,911 B1 * | 10/2001 | Nishikawa et al. | ........... 359/619 |
| 6,312,859 B1 | 11/2001 | Taniguchi | |
| 6,501,189 B1 * | 12/2002 | Kim et al. | .................... 257/797 |

(Continued)

FOREIGN PATENT DOCUMENTS

| | | |
|---|---|---|
| JP | 04-277611 | 10/1992 |
| JP | 6-60423 | 3/1994 |

(Continued)

OTHER PUBLICATIONS

Office Action issued by the Japanese Patent Office on Aug. 4, 2009 for Patent Application 2006-185115.

*Primary Examiner* — Tarifur Chowdhury
*Assistant Examiner* — Isiaka Akanbi
(74) *Attorney, Agent, or Firm* — Pillsbury Winthrop Shaw Pittman LLP

(57) ABSTRACT

A substrate distortion measurement apparatus comprising one or more optical detectors arranged to measure the locations of pits or holes provided in a substrate, a memory arranged to store previously determined locations of the pits or holes in the substrate, and a comparator arranged to compare the measured locations of the pits or holes with the previously determined locations of the pits or holes, to determine distortion of the substrate.

15 Claims, 7 Drawing Sheets

(56) References Cited

U.S. PATENT DOCUMENTS

| | | |
|---|---|---|
| 6,525,805 B2 | 2/2003 | Heinle |
| 6,528,219 B1 | 3/2003 | Conrad et al. |
| 6,597,509 B2 * | 7/2003 | Takakuwa et al. ........... 359/619 |
| 6,618,201 B2 * | 9/2003 | Nishikawa et al. .......... 359/619 |
| 6,724,479 B2 | 4/2004 | Zaidi |
| 6,753,948 B2 | 6/2004 | Taniguchi |
| 6,780,496 B2 * | 8/2004 | Bajt et al. .................... 428/216 |
| 6,798,925 B1 | 9/2004 | Wagman |
| 6,943,882 B2 | 9/2005 | Renwick et al. |
| 7,375,809 B2 | 5/2008 | Seipp |
| 7,385,675 B2 * | 6/2008 | George et al. ................. 355/55 |
| 7,410,735 B2 | 8/2008 | Reuhman-Huisken et al. |
| 2002/0006561 A1 | 1/2002 | Taniguchi |
| 2002/0100978 A1 | 8/2002 | Tomita et al. |
| 2002/0145118 A1 | 10/2002 | Pearce-Percy |
| 2003/0035090 A1 | 2/2003 | Imai et al. |
| 2003/0063278 A1 | 4/2003 | Zaidi |
| 2003/0066896 A1 * | 4/2003 | Pettersson et al. ........... 235/494 |
| 2003/0211409 A1 | 11/2003 | Nunes |
| 2004/0008352 A1 | 1/2004 | Hirokawa et al. |
| 2004/0025322 A1 | 2/2004 | Binnard |
| 2004/0090194 A1 | 5/2004 | Gesley |
| 2004/0108812 A1 | 6/2004 | Janaway et al. |
| 2004/0119956 A1 | 6/2004 | Fukagawa |
| 2004/0201789 A1 * | 10/2004 | Akiyama ....................... 349/43 |
| 2005/0099615 A1 | 5/2005 | Ishii |
| 2005/0099628 A1 | 5/2005 | Kokumai |

FOREIGN PATENT DOCUMENTS

| | | |
|---|---|---|
| JP | 09-306818 | 11/1997 |
| JP | 63-261727 | 10/1998 |
| JP | 2001-176769 | 6/2001 |
| JP | 2004-343113 | 12/2004 |

* cited by examiner

SUBSTRATE DISTORTION MEASUREMENT

This application is a divisional of U.S. patent application Ser. No. 11/175,033 filed on Jul. 6, 2005, now allowed. The entire contents of the foregoing application is herein fully incorporated by reference.

FIELD

The present invention relates, inter alia, to substrate distortion measurement, to a substrate, and to lithography.

BACKGROUND

Lithography is used to apply a desired pattern onto a lithographic substrate or part of a lithographic substrate. Lithography may be used, for example, in the manufacture of integrated circuits (ICs), flat panel displays, and other devices involving fine structures. In conventional lithography, a patterning device, which may be referred to as a mask or a reticle, may be used to generate a circuit pattern corresponding to an individual layer of a flat panel display (or other device). This pattern may be transferred on (part of) the substrate (e.g. a silicon wafer), e.g. via imaging onto a layer of radiation-sensitive material (resist) provided on the substrate.

Instead of a circuit pattern, the patterning device may be used to generate other patterns, for example a color filter pattern, or a matrix of dots. Instead of a mask, the patterning device may comprise a patterning array that comprises an array of individually controllable elements. An advantage of such a system compared to a mask-based system is that the pattern can be changed more quickly and for less cost.

Although lithography is conventionally used to image a pattern onto a silicon wafer, it may also be used to image a pattern onto any other suitable substrate. Substrates onto which patterns may be imaged include, e.g., glass substrates such as for instance relatively large glass substrates for flat panel displays, or plastic. Substrates of this type may be more likely to suffer from distortion than silicon wafers. Since lithography systems are often designed to project patterns onto silicon wafers, in some instances they may only be able to measure a limited amount of substrate distortion. This measurement may be insufficient in some instances for flat panel display substrates or flexible substrates.

SUMMARY

The invention overcomes these problems of known systems.

In an embodiment, the invention provides a method comprising:

(i) measuring the locations of marks on a substrate;
(ii) comparing the measured locations with previously determined locations of the marks to determine distortions in the substrate;
(iii) exposing the substrate to patterned radiation.

In an embodiment, the invention provides a substrate comprising a photosensitive layer and a mark layer having at least 1000 marks.

Also, there is provided a substrate distortion measurement apparatus comprising one or more optical detectors arranged to measure the locations of pits or holes provided in a substrate, a memory arranged to store previously determined locations of the pits or holes in the substrate, and a comparator arranged to compare the measured locations of the pits or holes with the previously determined locations of the pits or holes, to determine distortion of the substrate.

In addition, there is provided a substrate distortion measurement apparatus comprising a detector arranged to measure the locations of marks provided on a substrate, a memory arranged to store previously measured locations of the marks on the substrate, a comparator arranged to compare the measured locations of the marks with the previously measured locations of the marks, to determine distortion of the substrate.

Furthermore, there is provided a substrate provided with an array of pits or holes, the array arranged to allow distortion of the substrate to be determined by measuring the locations of the pits or holes and comparing the measured locations of the pits or holes with previously determined locations of the pits or holes.

Also, there is provided a method of measuring the distortion of a substrate, the method comprising measuring the locations of pits or holes provided in the substrate and comparing the measured locations of the pits or holes with previously determined locations of the pits or holes, to determine distortion of the substrate.

DETAILED DESCRIPTION

Figure 1:
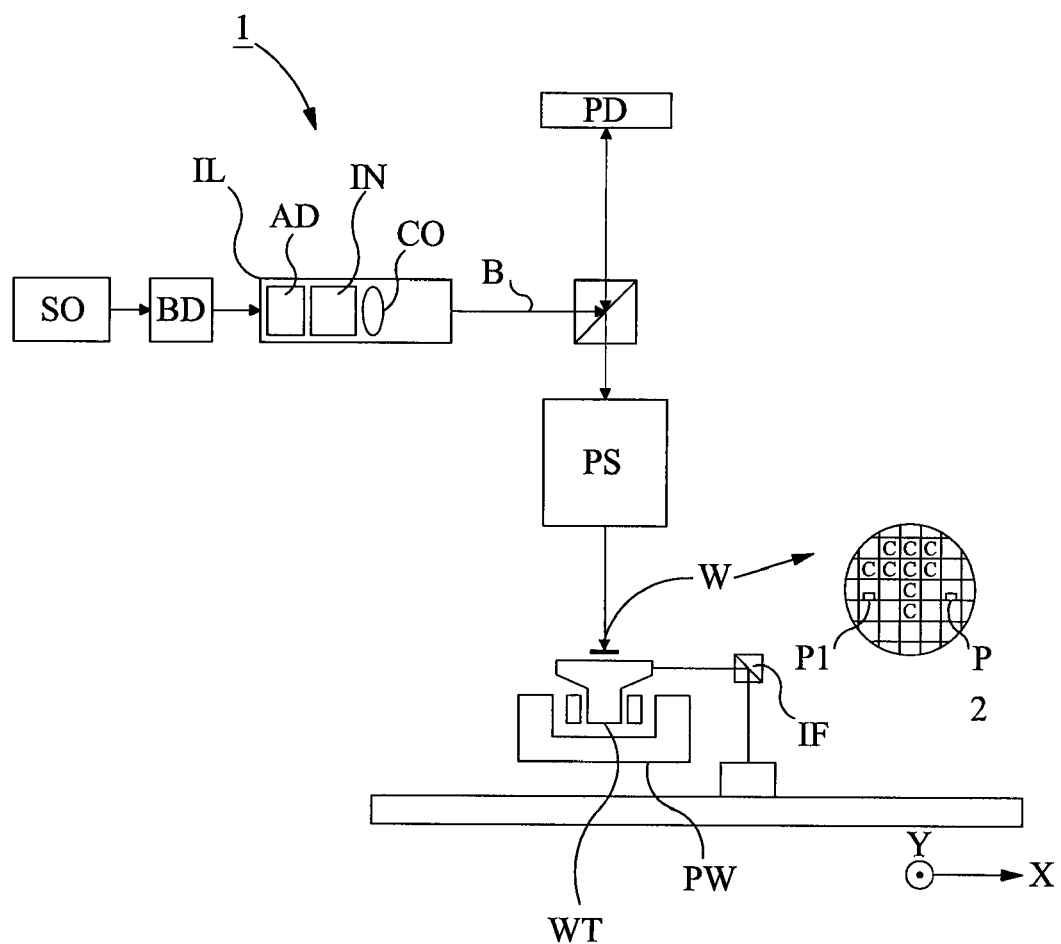
FIG. 1 depicts a lithographic apparatus according to an embodiment of the invention.

FIG. 1 schematically depicts a lithographic apparatus according to an embodiment of the invention. The apparatus comprises:

an illumination system (illuminator) IL configured to condition a radiation beam B (e.g. UV radiation);

a patterning device PD (e.g. an array of individually controllable elements) that modulates the projection beam; in general the position of the array of individually controllable elements will be fixed relative to item PS; however it may instead be connected to, e.g., a positioner configured to accurately position the array of individually controllable elements in accordance with certain parameters;

a substrate table WT constructed to support a substrate (e.g. a resist-coated substrate) W and connected to a positioner PW configured to accurately position the substrate in accordance with certain parameters; and a projection system (e.g. a refractive projection lens system) PS configured to project the beam of radiation modulated by the array of individually controllable elements onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The term "patterning device", used herein should be broadly interpreted as referring to any device that can be used to modulate the cross-section of a radiation beam such as to create a pattern in a target portion of the substrate. It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures during which the pattern on the array of individually controllable elements and/or the relative position of the substrate changes. Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays. Patterning devices whose pattern is programmable with the aid of electronic means (e.g., a computer), such as patterning devices comprising a plurality of programmable elements that can modulate the intensity of a portion of the radiation beam, (e.g., all the devices mentioned in the previous sentence except for the reticle), including electronically programmable patterning devices having a plurality of programmable elements that impart a pattern to the radiation beam by modulating the phase of a portion of the radiation beam relative to adjacent portions of the radiation beam, are collectively referred to herein as "contrast devices". In an embodiment, the patterning device comprises at least 10 programmable elements, e.g. at least 100, at least 1000, at least 10000, at least 100000, at least 1000000, or at least 10000000 programmable elements. Embodiments of several of these devices are discussed in some more detail below:

A programmable mirror array. This may comprise a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate spatial filter, the said undiffracted light can be filtered out of the reflected beam, leaving only the diffracted light to reach the substrate; in this manner, the beam becomes patterned according to the addressing pattern of the matrix-addressable surface. It will be appreciated that, as an alternative, the filter may filter out the diffracted light, leaving the undiffracted light to reach the substrate. An array of diffractive optical MEMS devices may also be used in a corresponding manner. A diffractive optical MEMS device is comprised of a plurality of reflective ribbons that may be deformed relative to one another to form a grating that reflects incident light as diffracted light. A further alternative embodiment of a programmable mirror array employs a matrix arrangement of tiny mirrors, each of which may be individually tilted about an axis by applying a suitable localized electric field, or by employing piezoelectric actuation components. Once again, the mirrors are matrix-addressable, such that addressed mirrors reflect an incoming radiation beam in a different direction to unaddressed mirrors; in this manner, the reflected beam may be patterned according to the addressing pattern of the matrix-addressable mirrors. The required matrix addressing may be performed using suitable electronic means. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference in their entirety.

A programmable LCD array. An example of such a construction is given in U.S. Pat. No. 5,229,872, which is incorporated herein by reference in its entirety.

The lithographic apparatus may comprise one or more patterning devices, e.g. one or more contrast devices. For example, it may have a plurality of arrays of individually controllable elements, e.g. each controlled independently of each other. In such an arrangement, some or all of the arrays of individually controllable elements may have at least one of a common illumination system (or part of an illumination system), a common support structure for the arrays of individually controllable elements and/or a common projection system (or part of the projection system).

In an embodiment, such as the embodiment depicted in FIG. 1, the substrate W has a substantially circular shape, optionally with a notch and/or a flattened edge along part of its perimeter. In an embodiment, the substrate has a polygonal shape, e.g. a rectangular shape. Embodiments where the substrate has a substantially circular shape include embodiments where the substrate has a diameter of at least 25 mm, for instance at least 50 mm, at least 75 mm, at least 100 mm, at least 125 mm, at least 150 mm, at least 175 mm, at least 200 mm, at least 250 mm, or at least 300 mm. In an embodiment, the substrate has a diameter of at most 500 mm, at most 400 mm, at most 350 mm, at most 300 mm, at most 250 mm, at most 200 mm, at most 150 mm, at most 100 mm, or at most 75 mm. Embodiments where the substrate is polygonal, e.g. rectangular, include embodiments where at least one side, e.g. at least 2 sides or at least 3 sides, of the substrate has a length of at least 5 cm, e.g. at least 25 cm, at least 50 cm, at least 100 cm, at least 150 cm, at least 200 cm, or at least 250 cm. In an embodiment, at least one side of the substrate has a length of at most 1000 cm, e.g. at most 750 cm, at most 500 cm, at most 350 cm, at most 250 cm, at most 150 cm, or at most 75 cm. In an embodiment, the substrate is a rectangular substrate having a length of about 225-275 cm and a width of about 250-300 cm. The thickness of the substrate may vary and, to an extent, may depend, e.g., on the substrate material and/or the substrate dimensions. In an embodiment, the thickness is at least 50 µm, for instance at least 100 µm, at least 200 µm, at least 300 µm, at least 400 µm, at least 500 µm, or at least 600 µm. In one embodiment, the thickness of the substrate is at most 5000 µm, for instance at most 3500 µm, at most 2500 µm, at most 1750 µm, at most 1250 µm, at most 1000 µm, at most 800 µm, at most 600 µm, at most 500 µm, at most 400 µm, or at most 300 µm. The substrate referred to herein may be processed, before or after exposure, in for example a track (a tool that typically applies a layer of resist to a substrate and develops the exposed resist). Properties of the substrate may be measured before or after exposure, for example in, a metrology tool and/or an inspection tool.

In an embodiment, a resist layer is provided on the substrate. In an embodiment, the substrate W is a wafer, for instance a semiconductor wafer. In an embodiment, the wafer material is selected from the group consisting of Si, SiGe, SiGeC, SiC, Ge, GaAs, InP, and InAs. In an embodiment, the wafer is a III/V compound semiconductor wafer. In an embodiment, the wafer is a silicon wafer. In an embodiment, the substrate is a ceramic substrate. In an embodiment, the substrate is a glass substrate. Glass substrates may be useful, e.g., in the manufacture of flat panel displays and liquid crystal display panels. In an embodiment, the substrate is a plastic substrate. In an embodiment, the substrate is flexible. In an embodiment, the substrate is transparent (for the naked human eye). In an embodiment, the substrate is colored. In an embodiment, the substrate is absent a color.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The projection system may image the pattern on the array of individually controllable elements such that the pattern is coherently formed on the substrate; alternatively, the projection system may image secondary sources for which the elements of the array of individually controllable elements act as shutters. In this respect, the projection system may comprise an array of focusing elements such as a micro lens array (known as an MLA) or a Fresnel lens array, e.g. to form the secondary sources and to image spots onto the substrate. In an embodiment, the array of focusing elements (e.g., MLA) comprises at least 10 focus elements, e.g. at least 100 focus elements, at least 1000 focus elements, at least 10000 focus elements, at least 100000 focus elements, or at least 1000000 focus elements. In an embodiment, the number of individually controllable elements in the patterning device is equal to or greater than the number of focusing elements in the array of focusing elements. In an embodiment, the array of focusing elements comprises a focusing element that is optically associated with one or more of the individually controllable elements in the array of individually controllable elements, e.g. with 2 or more of the individually controllable elements in the array of individually controllable elements, such as 3 or more, 5 or more, 10 or more, 20 or more, 25 or more, 35 or more, or 50 or more; in an embodiment, the focusing element is optically associated with less than 5000 individually controllable elements, e.g. less than 2500, less than 1000, less than 500, or less than 100. In an embodiment, the array of focusing elements comprises more than one focusing element (e.g. more than 1000, the majority, or about all) that is optically associated with one or more of the individually controllable elements in the array of individually controllable elements. In an embodiment, the MLA is movable (e.g. with the use of actuators) at least in the direction to and away from the substrate, e.g. with the use of one or more actuators. Being able to move the MLA to and away from the substrate allows, e.g., for focus adjustment without having to move the substrate.

As here depicted, the apparatus is of a reflective type (e.g. employing a reflective array of individually controllable elements). Alternatively, the apparatus may be of a transmissive type (e.g. employing a transmissive array of individually controllable elements).

The lithographic apparatus may be of a type having two (dual stage) or more substrate tables. In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by an "immersion liquid" having a relatively high refractive index, e.g. water, so as to fill a space between the projection system and the substrate. An immersion liquid may also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. In an embodiment, the radiation source provides radiation having a wavelength of at least 5 nm, e.g. at least 10 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In an embodiment, the radiation provided by radiation source SO has a wavelength of at most 450 nm, e.g. at most 425 nm, at most 375 nm, at most 360 nm, at most 325 nm, at most 275 nm, at most 250 nm, at most 225 nm, at most 200 nm, or at most 175 nm. In an embodiment, the radiation has a wavelength including 436 nm, 405 nm, 365 nm, 355 nm, 248 nm, 193 nm, 157 nm, 126 nm, and/or 13.5 nm. In an embodiment, the radiation includes a wavelength of around 365 nm or around 355 nm. In an embodiment, the radiation includes a broad band of wavelengths, for example encompassing 365, 405 and 436 nm. A 355 nm laser source could be used. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system. If the patterning device is a light source itself, e.g. a laser diode array or a light emitting diode array, the apparatus may be designed without an illumination system or at least a simplified illumination system (e.g., the need for radiation source SO may be obviated).

The illuminator IL, may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam to have a desired uniformity and intensity distribution in its cross-section. The illuminator IL, or an additional component associated with it, may also be arranged to divide the radiation beam into a plurality of sub-beams that may, for example, each be associated with one or a plurality of the individually controllable elements of the array of individually controllable elements. A two-dimensional diffraction grating may, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g. an interferometric device, linear encoder or capacitive sensor), the substrate table WT can be moved accurately, e.g. so as to position different target portions C in the path of the radiation beam B. Where used, the positioning components for the array of individually controllable elements can be used to correct accurately the position of the patterning device PD with respect to the path of the beam B, e.g. during a scan. In an embodiment, movement of the substrate table WT is realized with the aid of a long-stroke module (course positioning) and a short-stroke module (fine positioning), which are not explicitly depicted in FIG. 1. In an embodiment, the apparatus is absent at least a short stroke module for moving substrate table WT. A similar system may also be used to position the array of individually controllable elements. It will be appreciated that the projection beam B may alternatively/additionally be moveable while the object table and/or the array of individually controllable elements may have a fixed position to provide the required relative movement. Such an arrangement may assist in limiting the size of the apparatus. As a further alternative, which may e.g. be applicable in the manufacture of flat panel displays, the position of the substrate table WT and the projection system PS may be fixed and the substrate W may be arranged to be moved relative to the substrate table WT. For example, the substrate table WT may be provided with a system for scanning the substrate W across it at a substantially constant velocity.

As shown in FIG. 1, the beam of radiation B may be directed to the patterning device PD by means of a beam splitter BS configured such that the radiation is initially reflected by the beam splitter and directed to the patterning device PD. It should be realized that the beam of radiation B may also be directed at the patterning device without the use of abeam splitter. The patterning device PD modulates the beam of radiation B and reflects it back to the beam splitter BS which transmits the modulated beam to the projection system PS. It will be appreciated, however, that alternative arrangements may be used to direct the beam of radiation B to the patterning device PD and subsequently to the projection system PS. In particular, an arrangement such as is shown in FIG. 1 may not be required if a transmissive patterning device is used.

The depicted apparatus can be used in four preferred modes:

1. In step mode, the array of individually controllable elements and the substrate are kept essentially stationary, while an entire pattern imparted to the radiation beam is projected onto a target portion C at one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e. a single dynamic exposure). The velocity and direction of the substrate relative to the array of individually controllable elements may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the projection beam B is caused to scan a line across the substrate W. The pattern on the array of individually controllable elements is updated as required between pulses of the radiation system and the pulses are timed such that successive target portions C are exposed at the required locations on the substrate W. Consequently, the projection beam B can scan across the substrate W to expose the complete pattern for a strip of the substrate. The process is repeated until the complete substrate W has been exposed line by line.

4. In continuous scan mode, essentially the same as pulse mode except that the substrate W is scanned relative to the modulated beam of radiation B at a substantially constant speed and the pattern on the array of individually controllable elements is updated as the projection beam B scans across the substrate W and exposes it. A substantially constant radiation source or a pulsed radiation source, synchronized to the updating of the pattern on the array of individually controllable elements may be used.

Combinations and/or variations on the above described modes of use or entirely different modes of use may also be employed.

In order to form the required pattern on the substrate when a contrast device is used as the patterning device, the individually controllable elements in the patterning device are set to the requisite state at the various stages of the exposure process. Therefore control signals, representing the requisite states, are transmitted to the individually controllable elements. Preferably, the lithographic apparatus includes a controller that generates the control signals. The pattern to be formed on the substrate may be provided to the lithographic apparatus in a vector-defined format such as GDSII. In order to convert the design information into the control signals for each individually controllable element, the controller includes one or more data manipulation devices, each configured to perform a processing step on a data stream that represents the pattern. The data manipulation devices are sometimes also referred to collectively as the "datapath".

The data manipulation devices of the datapath may be configured to perform one or more of the following functions: converting vector-based design information into bitmap pattern data; converting bitmap pattern data into a required radiation dose map (namely a required radiation dose profile across the substrate); converting a required radiation dose map into required radiation intensity values for each individually controllable element; and converting the required radiation intensity values for each individually controllable element into corresponding control signals.

Figure 2:
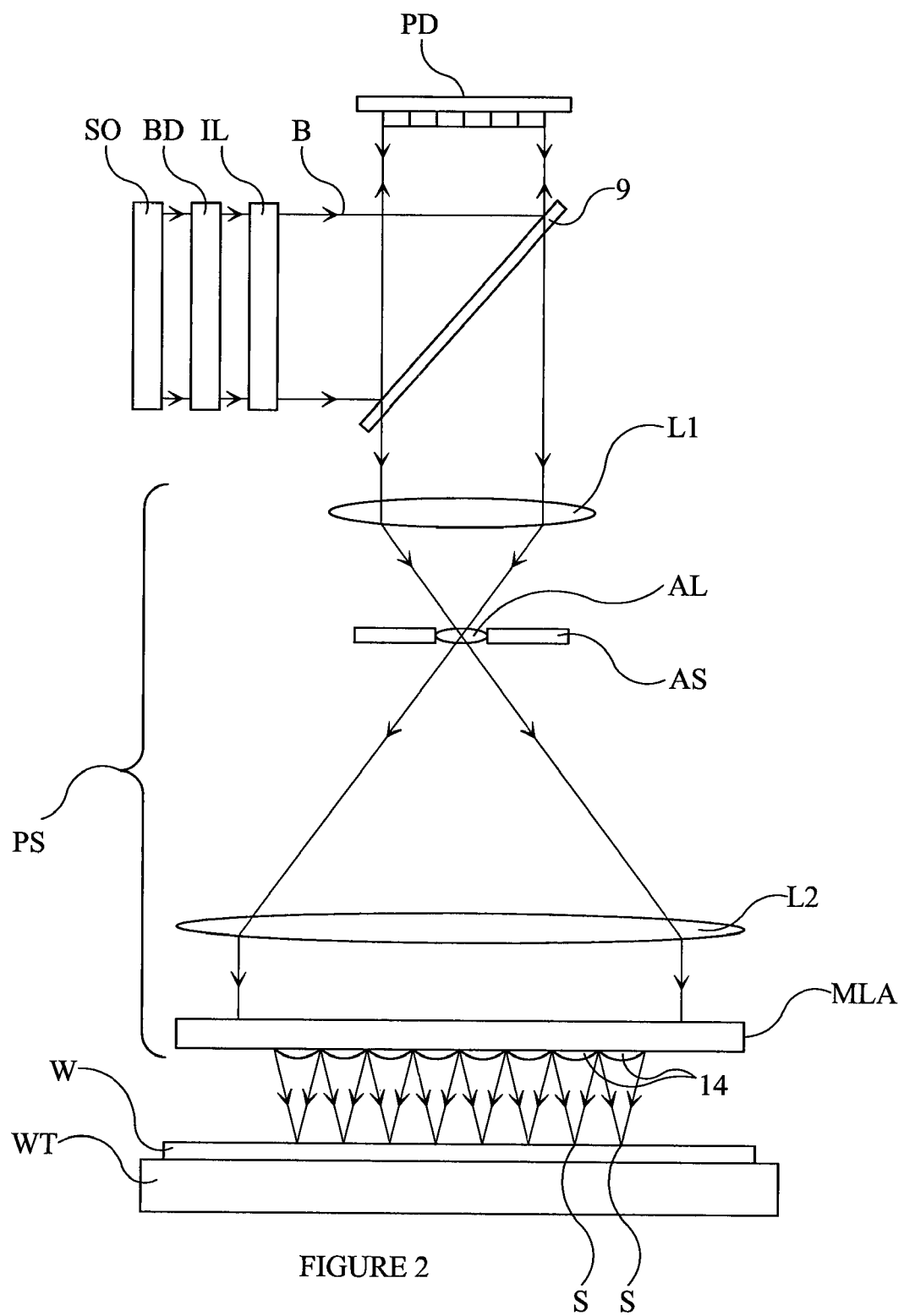
FIG. 2 depicts a lithographic apparatus according to another embodiment of the invention.

FIG. 2 depicts an embodiment of an apparatus according to the present invention that may be used, e.g., in the manufacture of flat panel displays. Components corresponding to those shown in FIG. 1 are depicted with the same reference numerals. Also, the above descriptions of the various embodiments, e.g. the various configurations of the substrate, the contrast device, the MLA, the beam of radiation, etc., remain applicable.

As shown in FIG. 2 the apparatus comprises a radiation source SO, a beam delivery system BD, an illuminator IL, and a projection system PS. The projection system PS includes a beam expander, which comprises two lenses L1, L2. The first lens L1 is arranged to receive the modulated radiation beam B and focus it through an aperture in an aperture stop AS. A further lens AL may be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses in the array of lenses MLA. Each lens ML focuses the respective portion of the modulated radiation beam B to a point that lies on the substrate W. In this way an array of radiation spots S is exposed onto the substrate W. It will be appreciated that, although only eight lenses ML of the illustrated array of lenses MLA are shown, the array of lenses may comprise many thousands of lenses (the same is true of the array of individually controllable elements used as the patterning device PD).

Figure 3:
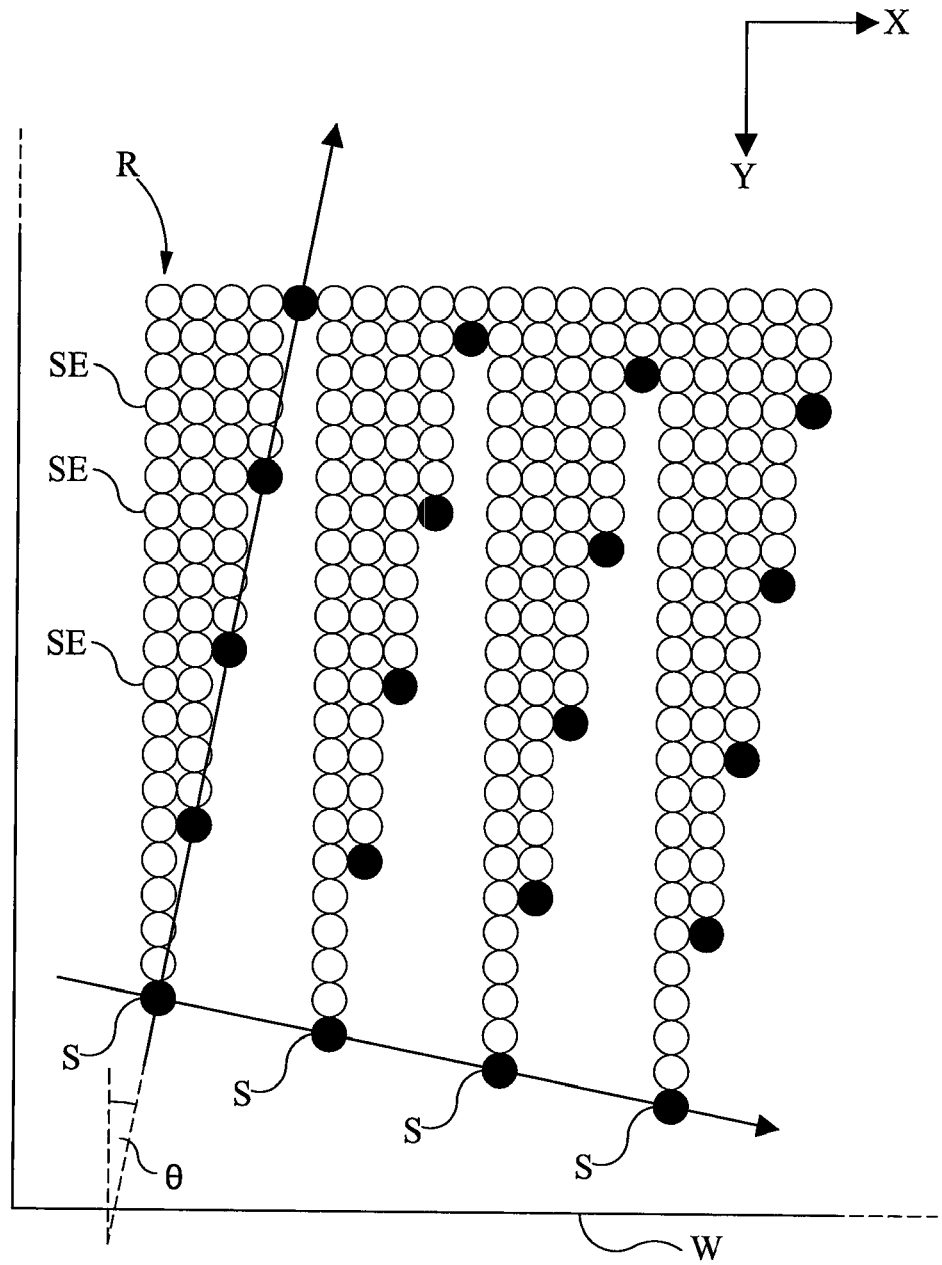
FIG. 3 depicts a mode of transferring a pattern to a substrate using an embodiment of the invention as show in FIG. 2.

FIG. 3 illustrates schematically how the pattern on the substrate W may be generated. The filled in circles represent the array of spots S projected onto the substrate by the array of lenses MLA in the projection system PS. The substrate is moved relative to the projection system in the Y direction as a series of exposures are exposed on the substrate. The open circles represent spot exposures SE that have previously been exposed on the substrate. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging." It will be appreciated by those skilled in the art that in practice there will be overlap between the spots S, to allow the surface of the substrate W to be properly exposed. The overlap is not shown in FIG. 3 for simplicity of illustration.

It can be seen that the array of radiation spots S is arranged at an angle θ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots S. In an embodiment, the angle θ is at most 20°, 10°, for instance at most 5°, at most 3°, at most 1°, at most 0.5°, at most 0.25°, at most 0.10°, at most 0.05°, or at most 0.01°. In an embodiment, the angle θ is at least 0.0001°, e.g. at least 0.001°.

Figure 4:
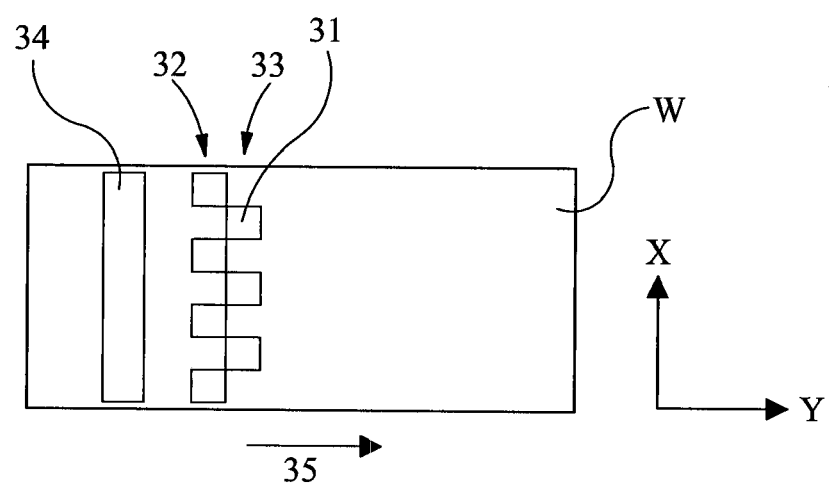
FIG. 4 depicts an arrangement of optical engines.

FIG. 4 shows schematically how an entire substrate W may be exposed in a single scan, by using a plurality of optical engines. Eight optical engines 31 are arranged to produce arrays of radiation spots (not shown). The optical engines 31 are arranged in two rows 32, 33 in a 'chess board' configuration such that the edge of one array of radiation spots slightly overlaps (in the x-direction) with the edge of the adjacent array of radiation spots. In an embodiment, a row of lasers and associated detectors 34 is provided beneath the substrate. The row of lasers and associated detectors 34 will be described in detail further below. In an embodiment, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines may be used. In an embodiment, the number of optical engines is at least 1, for instance at least 2, at least 4, at least 8, at least 10, at least 12, at least 14, or at least 17. In an embodiment, the number of optical engines is less than 40, e.g. less than 30 or less than 20.

Each optical engine may comprise a separate illumination system IL, patterning device PD and projection system PS as described above. It is to be appreciated, however, that two or more optical engines may share at least a part of one or more of the illumination system, patterning device and projection system.

Figure 5:
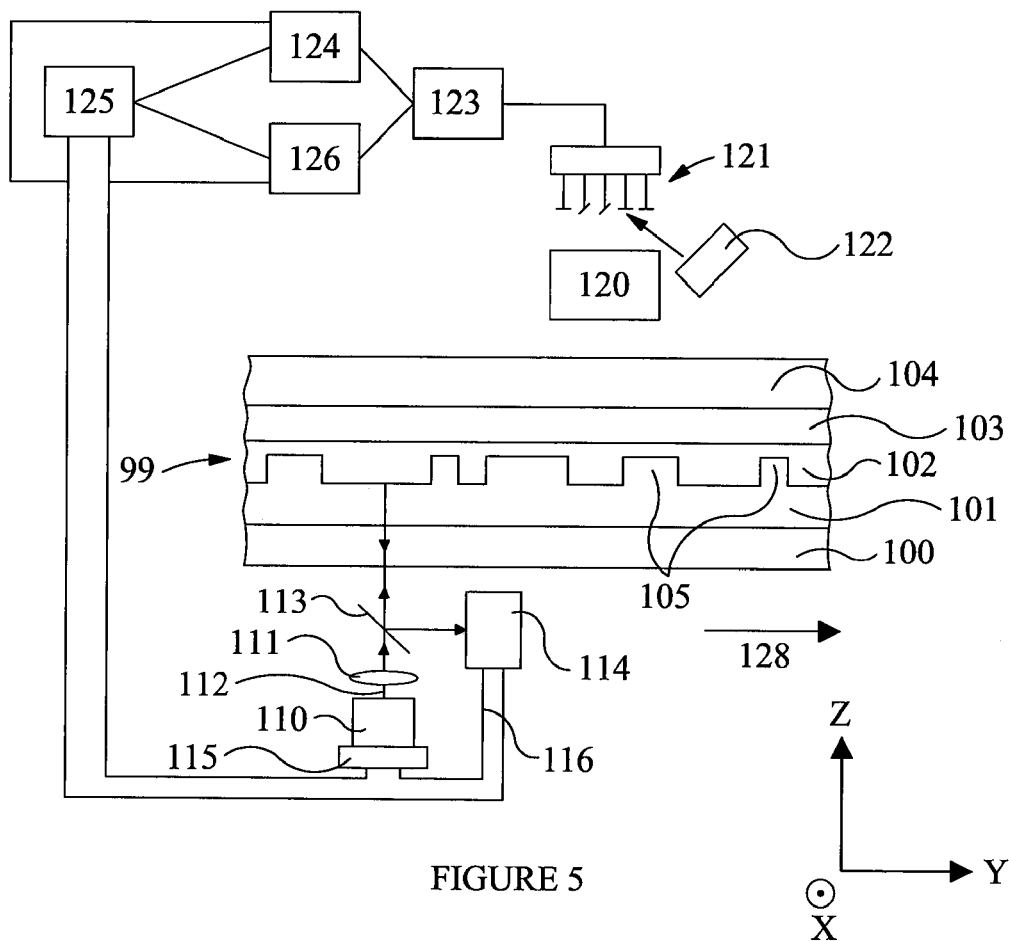
FIGS. 5 and 6 depict a lithographic apparatus which embodies the invention.

An embodiment of the invention, shown schematically in FIG. 5, comprises a substrate generally indicated as 99, provided on a substrate table 100. For ease of illustration, only a small portion of the substrate 99 is shown. The substrate 99 comprises a base layer 101 on top of which is provided a reflective layer 102. A protective layer 103 is provided on top of the reflective layer 102. Finally, a layer of resist 104 is provided on top of the protective layer 103.

The base layer 101 is provided with an array of pits 105. The array is two dimensional, although only one dimension of the array is shown in FIG. 5. In one fabrication method, the array of pits 105 may be formed in the base layer 101, for example by imprinting or by a lithographic process. The reflective layer 102 may then be applied onto the base layer 101, filling the pits 105 and providing a level (i.e. un-pitted) upper surface to receive the protective layer 103. In an alternative fabrication method, the protective layer 103 and the reflective layer 102 may first be provided, with the array of pits 105 being formed in the reflective layer 102 by for example imprinting or a lithographic process. Following this, the base layer 101 may be provided on the reflective layer 102, the base layer 101 filling the array of pits 105. Other fabrication methods will be apparent to those skilled in the art.

It will be appreciated that the substrate 99 may comprise a different structure, for example including different or additional layers. Similarly, it will be appreciated that the array of pits 105 may be provided in a different layer of the substrate 99 or, if the substrate has a structure different from that shown in FIG. 5, an additional layer which is not illustrated in FIG. 5.

Figure 6:
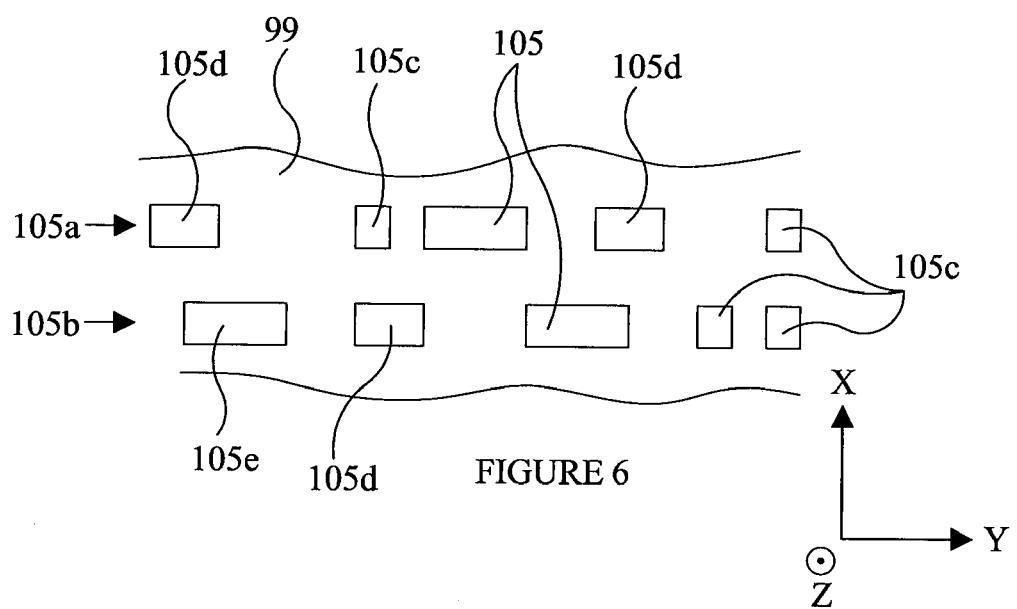

FIG. 6 is a schematic illustration, from below, of part of the substrate 99 shown in FIG. 5. Two rows of pits 105a, 105b, which form part of the array of pits, are shown in FIG. 6. The first row of pits 105a corresponds to the pits shown in FIG. 5. Cartesian coordinates are marked on FIGS. 5 and 6 for ease of comparison (the coordinates correspond with those conventionally used in lithography systems).

In an embodiment, the pits 105a, 105b may have a width of 500 nanometers. The pits may be 500 nanometers in length, or some multiple of 500 nanometers. For example, FIG. 6 shows four pits 105c which are 500 nanometers in length, three pits 105d which are 1000 nanometers in length, and three pits 105e which are 1500 nanometers in length. Other pits, may have lengths which are higher multiples of 500 nanometers. It will be appreciated that FIG. 6 is not intended to be an exact scale drawing, and that it is intended only to provide a schematic illustration. The pits 105 may in some cases not be rectangular, and may, e.g., instead be curved at either end. The pit width of 500 nanometers is used as an example, and it will be appreciated that other widths may be used. In an embodiment, the pit width is in the range of 100-1500 nm, e.g. 300-800 nm. Similarly, the pits may have lengths other than 500 nanometers and multiples thereof. In an embodiment, the pit length is in the range of 100-1500 nm, e.g. 300-800 nm, or multiples thereof.

Referring to FIG. 5, the substrate table 100 is formed from a material which is substantially transparent to light at a wavelength of light used to illuminate the array of pits 105. The light used to illuminate the array of pits may have a wavelength of for example 640 nanometers (red light). Examples of suitable material which may be used to form the substrate table 100 include, e.g., quartz, glass and silicon dioxide. In an embodiment, the base layer 101 of the substrate 99 is also substantially transparent at the wavelength of interest. In an embodiment, the base layer 101 may for example be formed from a polymer, which is transparent at the wavelength of interest. In an embodiment, the base layer 101 is a polycarbonate. In an embodiment, the base layer 101 may alternatively be formed from quartz, glass or silicon dioxide. In an embodiment, the thickness of the base layer is less than 1000 microns, e.g. less than 500 microns, less than 250 microns, or less than 100 microns. In an embodiment, the thickness of the base layer is at least 10 microns. The reflective layer 102 is preferably opaque and reflective for light at the wavelength of interest. The reflective layer 102 may for example be formed from aluminium, chromium, or another material which reflects light at the wavelength of interest. The protective layer 104 may for example be formed from a polymer, e.g. polycarbonate. Also, silicon dioxide, a relatively strong and transparent material, may be used. In an embodiment, a 50-100 micron layer of silicon dioxide is used.

A laser 110 is provided beneath the base layer 101, together with a lens 111. The laser 110 generates a beam 112 which is focused by the lens 111 to a focal plane which corresponds with pits 105 provided in the reflective layer 102. A beam splitter 113 is located between the lens 111 and the substrate 99, and is arranged to transmit the laser beam 112 so that it is incident upon the pits 105. The beam splitter 113 is further arranged to reflect light which is reflected from the reflective layer 102, so that the light is incident upon a detector 114. The use of the beam splitter in this way allows the laser beam 112 to be directed perpendicularly towards the substrate 99. The arrangement shown in FIG. 5 is configured such that the intensity of light incident upon the detector 114 is greater when the beam of light 112 is incident upon a pit 105 then when the beam of light is incident upon an area of the reflective layer 102 which does not have a pit. This is achieved because the focal plane of the beam 112 corresponds with the pits 105 and not with areas between the pits, with the effect that light reflected from the areas between the pits has a greater divergence and hence a lower intensity when it reaches the detector 114. The presence of the pits 105 in the reflective layer 102 is thereby detected by the detector 114. An alternative detection scheme, based upon using a reticle and looking at orders of diffracted light could e.g. be used.

In an alternative arrangement (not illustrated) a laser may be arranged to direct a beam of light at an angle to the substrate 99, the beam of light being reflected from the substrate (at a corresponding angle) onto a detector. Although this arrangement has the advantage that it does not require the use of a beam splitter, it suffers from the disadvantage that variations of the thickness of the substrate table 100 or the base layer 101 may cause deviation of the reflected beam, thereby introducing measurement errors.

The laser 110 is mounted on a servo 115, which is arranged to move the laser in the x-direction. The servo 115 includes a feedback circuit 116 which is connected to the detector 114, and which is arranged to ensure that the servo and laser 110 track a given row of pits 105a, even if there is distortion of the row of pits in the x-direction. A second servo (not illustrated) may be used to move the laser 110 and the lens 111 in the z-direction (in practice the laser and the lens may be provided as a single entity). This allows adjustment of the position of the focal plane of the laser beam 112.

In an embodiment, a separate laser 110 and a separate detector 114 may be provided for each row of pits 105a, 105b. It will be appreciated that in practice there may be many thousands of rows of pits, and a corresponding number of lasers and detectors may be used. In an alternative arrangement, each detector may be arranged to detect light from several rows of pits 105 (for example by using an imaging detector). In a further alternative arrangement, a set of lasers and associated detectors may be mounted on a servo such that they can be translated as a unit. The set of lasers and detectors extends in the x-direction beneath only a portion of the substrate. The substrate is passed over the set of lasers and detectors, thereby allowing pits in a portion of the substrate to be detected. The set of lasers and detectors are then moved in the x-direction using the servo, and used to detect pits in a second portion of the substrate. This is repeated until pits have been detected over the entire surface of the substrate.

Any distortion of the substrate will lead to a corresponding distortion of the array of pits, and this distortion of the array of pits 105 will be measured by the embodiment of the invention. For example, a distortion in the x-direction of the substrate 101 will cause the pits to be shifted in the x-direction at the location of the distortion. The servo 115 upon which the laser 110 is mounted will automatically adjust the position of the laser in the x-direction in order to keep the laser beneath the row of pits 105a, as the substrate 99 is scanned over the laser. An output signal from the servo 115 indicates the movement of the laser 110 in the x-direction, and therefore indicates the distortion of the substrate in the x-direction.

Distortion of the substrate in the y-direction will cause a lengthening or shortening of the pits 105 in the y-direction in the region of the distortion. The distortion can be measured by comparing the sizes and locations of the pits 105 with previously recorded sizes and locations of the pits.

FIG. 5 schematically shows devices which are used to control the exposure of a pattern onto the substrate 99. These comprise a projection lens 120 used to project a pattern onto the layer of resist 104, an array of moveable mirrors 121 that form the pattern to be projected, and an optical source 122 which is arranged to illuminate the array of moveable mirrors. The array of moveable mirrors is controlled by control electronics 123. Although the projection lens 120, moveable mirrors 121 and optical source 122 are shown very schematically, suitable configurations for these will be apparent to those skilled in the art (the configurations shown in FIGS. 1 and 2 may for example be used).

An output from the detector 114 is connected to a comparator 124 and to a memory 125. The comparator 124 is also connected to the memory 125. An output from the comparator 124 is connected to the control electronics 123.

An output from the servo 115 is connected to the memory 125 and to a second comparator 126. An output from the second comparator 126 is connected to the control electronics 123.

In use, a substrate 99 is provided on the substrate table 100, and a first pattern layer is exposed onto the layer of resist 104 using the optical source 122, the array of moveable mirrors 121 and the projection lens 120. This is done without adjusting the pattern formed by the array of moveable mirrors 121 to take account of any distortion of the substrate 99. This is because there is no pattern already present on the substrate 99 with respect to which the pattern to be projected must be aligned.

During exposure of the pattern onto the substrate 99, the passage of the pits 105 over the laser beam causes modulation of the beam, which is detected by the detector 114. An output signal from the detector 114 is stored in the memory 125. The stored data comprises the length and separations of all of the pits 105 in the row of pits 105a (see FIG. 6) detected by the detector 114. This stored pattern is defined as the undistorted original layout of the substrate 99, since the pattern projected onto the substrate is undistorted when the substrate 99 has this form. The measurement of the length and separation of the pits 105 is performed by additional detectors (not illustrated) for all other rows of the array of pits 105 on the substrate 99

The output from the servo 115 is also recorded during the exposure of the pattern onto the substrate 99, and this output is stored in the memory 125. Although deviations in the x-direction of the row of pits 105a may be seen, this is treated as being the undistorted layout of the substrate, since the pattern projected onto the substrate is undistorted when the substrate 99 has this form. The output is recorded from a servo at each row of pits 105 across the substrate, and stored in the memory 125.

Following exposure the substrate 99 is processed, typically by chemically processing the layer of resist 104 and then baking the substrate so that the pattern imaged into the layer of resist 104 is permanently retained on the substrate. A new layer of resist is then provided on the substrate 99.

When the substrate is reintroduced into the lithographic apparatus, it is desired that the pattern projected onto the new layer of resist is properly aligned with the previously exposed pattern, i.e. takes account of distortion of the substrate 99 which occurred after exposure of the previous pattern. Typically, during the chemical processing and baking of the substrate 99, the substrate will have been distorted. The embodiment of the invention allows the pattern projected by the array of moveable mirrors 121 to be adjusted so that it corresponds to the, now distorted, pattern that was previously projected onto the substrate 99.

Referring to FIG. 5 and FIG. 4, it can be seen that exposure of the substrate W, 99 is provided by a row of projection systems 31, 120 which extend in the x-direction across the substrate. The substrate W, 99 is scanned in the y-direction beneath the projection system, and the pattern provided on the array of movable mirrors 121 is continually updated, thereby applying a varying pattern onto the substrate. The direction of scanning movement of the substrate W, 99 is shown by an arrow 35, 128. The laser 110 and detector 114 form part of a row 34 of lasers and associated detectors. They are located upstream of the projection system 120, i.e. a given region of the substrate 99 will pass over the laser beam 112 before it passes beneath the projection system 120.

During the second exposure onto the substrate 99, the detector 114 detects a row of pits 105a, and sends an output signal (which is modulated by the pits 105) to the comparator 124. The comparator 124 compares the output from the detector 114 with the pattern stored in the memory 125 for that row of pits 105a during the first exposure onto the substrate 99. Differences between the two patterns, which indicate distortion of the substrate in the y-direction are sent to the control electronics 123. The control electronics 123 adjust the pattern provided on the array of moveable mirrors 121 accordingly. Since the laser 110 is located upstream of the projection system 120, by the time the region of the substrate which was measured by the laser 110 has passed to the projection system 120, the calculation of the adjustment of the pattern has been performed, and the adjusted pattern is ready on the array of moveable mirrors 121. The adjusted pattern can thus be projected via the projection system 120 onto the substrate 99. In an alternative arrangement (discussed further below) the distortion of the substrate may be measured prior to exposure taking place.

The measurement of distortion in the y-direction, and correction of the pattern provided on the moveable mirrors 121, is performed for all lasers and associated detectors provided in the row 34 (see FIG. 4) which extends across the substrate W, 99.

In addition to adjusting the pattern on the array of moveable mirrors 121 to take account of distortion in the y-direction, the embodiment of the invention also adjusts the pattern to take account of distortion in the x-direction. This is done by sending the output of the servo 115 to the comparator 124, which compares the output with data stored in the memory 125 during the first exposure. Any difference between the output and the stored data indicates distortion of the substrate 99 in the x-direction after the first exposure onto the substrate 99. This difference is output to the control electronics 123, which adjusts the pattern provided on the array of moveable mirrors 121 accordingly. The measurement of distortion in the x-direction, and correction of the pattern provided on the moveable mirrors 121, is performed for all lasers provided in the row 34 (see FIG. 4) which extends across the substrate W, 99.

Following exposure, the substrate 99 is once again chemically processed and baked. A subsequent layer of resist may be applied to the substrate 99 and an image projected onto the substrate, with any distortion of the substrate being measured and corrected for in the manner described above. This may be repeated for further layers. In each case, the sizes and locations of the pits 105 are compared with the sizes and locations stored during the first exposure, and any differences are passed to the control electronics 123, which adjusts the pattern provided on the array of moveable mirrors 121 accordingly. Distortion of the base layer 101, as detected by the detector 114, is assumed to correspond with the distortion of the uppermost layer on the substrate. In practice this is an accurate assumption because the base typically forms 99% of the thickness of the substrate.

In an alternative methodology, the sizes and locations of the pits 105 measured before imaging of a particular layer are compared with the sizes and locations of the pits 105 that were previously measured before imaging the preceding layer. Differences between the two correspond to distortion which is corrected for by adjusting the pattern provided on the array of moveable mirrors 121. In this methodology, the adjustment of the pattern provided on the array of moveable mirrors is cumulative. In other words, distortion adjustments that were made for a preceding layer are stored, and are added to the distortion adjustments required for the next layer.

An advantage of the embodiment of the invention is that the array of pits 105 does not need to be accurately provided on the substrate. Prior art alignment systems rely on the assumption that when alignment marks are provided on the substrate, they are provided in precisely the correct location.

Any subsequently measured deviation of the alignment mark is determined in relation to the correct location, at which it is assumed that the alignment marks were originally provided. In contrast to this, the embodiment of the invention measures the sizes and locations of the pits 105 during the first exposure, and records this data. The recorded sizes and locations of the pits 105 are then used to determine the correct locations for all subsequent exposures. It is not necessary that the pits 105 are in 'correct' locations during the first exposure; all that is necessary is that the sizes and locations of the pits 105 are recorded to provide a reference for the subsequent exposures.

Although the described embodiment of the invention uses a laser 110 and detector 114 located below the substrate 99, it will be appreciated that a laser and detector may alternatively (or additionally) be provided above the substrate. Where this is done, the structure of the substrate 99 may be different, for example with an array of pits being provided in an upper surface of the reflective layer, so that the array of pits are visible from above the substrate.

Although the illustrative embodiment above has been described using light at 640 nanometers, it will be appreciated that any other suitable wavelength may be used, e.g. 635, 650 or 735 nanometer light (these wavelengths may be generated by low cost semiconductor lasers).

Figures 7A, 7B:
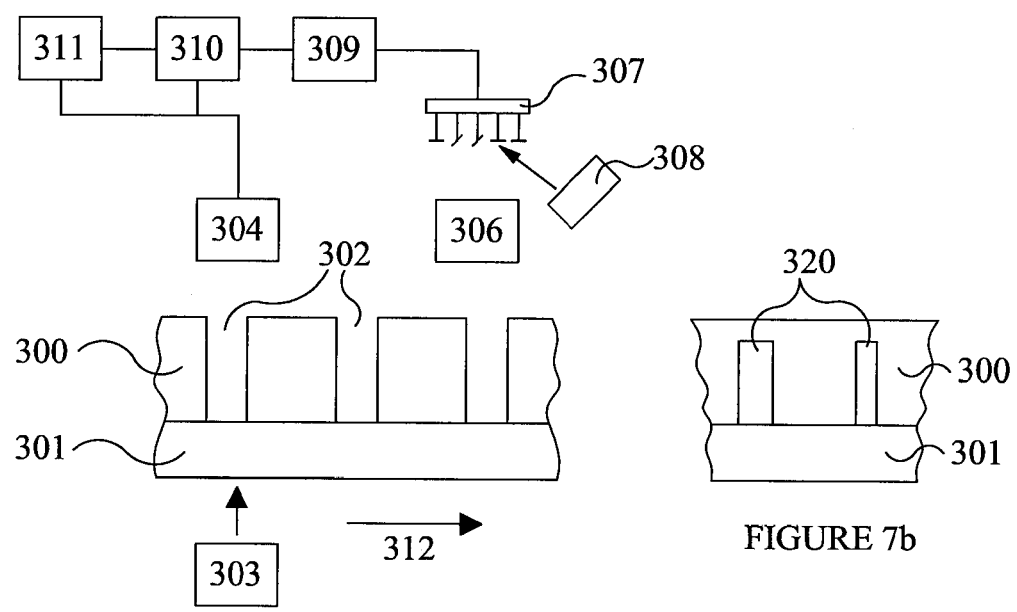
FIGS. 7 to 10 depict another lithographic apparatus which embodies the invention.

An alternative embodiment of the invention is shown in FIG. 7a. A substrate 300 is provided on a substrate table 301. The substrate 300 is provided with an array of holes 302, which are illuminated from below by a light source 303. A detector 304 is mounted above the substrate 300, and is arranged to detect light which passes through the array of holes 302. The detector 304 may for example be a CCD camera or some other form of imaging detector. The light source 303 may for example be a diffuse light source. The substrate table 301 is transparent at the wavelength (or a subset of wavelengths) of light provided by the light source 303.

Figure 8:
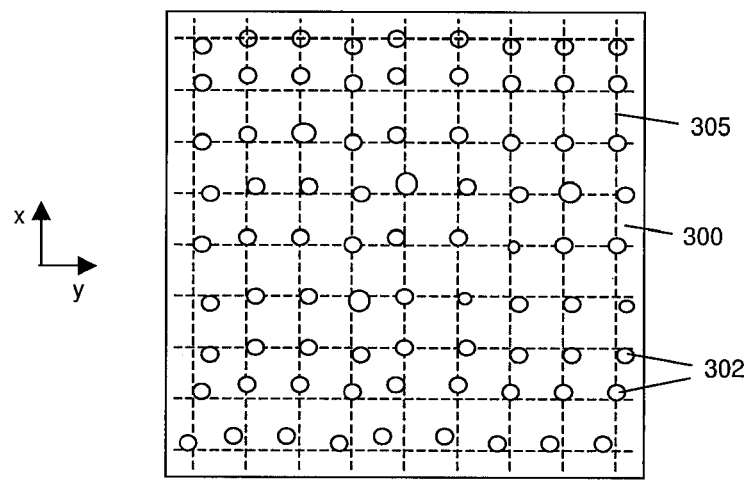

FIG. 8 shows schematically from above the substrate 300 and the array of holes 302. For illustrative purposes a grid 305 has also been shown in FIG. 8 (this grid is not present on the substrate). In an embodiment, the holes have a diameter in the range of about 0.05-0.5 microns. In an embodiment, the holes have a diameter of about 0.1 microns and are spaced apart by 1 micron. The holes may be formed, e.g., by wet etching, laser drilling, or any other suitable process. The holes are generally made prior to lithography taking place, e.g. during manufacture of the substrate.

It is not necessary that the positions and sizes of the holes 302 are accurate. For example, as shown in FIG. 8, the holes 302 may deviate significantly from their nominal positions (this is shown by holes 302 that do not coincide with the locations at which lines of the grid 305 cross). In addition, it is not necessary that the holes all be of identical size, as is shown schematically in FIG. 8.

As shown schematically in FIG. 7, a projection system 306 is arranged to project a pattern onto a layer of resist on the substrate 300. An array of moveable mirrors 307 is arranged to form the pattern that is projected by the projection system 306, the array of moveable mirrors being illuminated by an optical source 308. The array of moveable mirrors 307 is controlled by control electronics 309. An output from the detector 304 is connected to a comparator 310, and a second output from the detector 304 is connected to a memory 311. An output from the comparator 310 is connected to the control electronics 309. Suitable configurations for the projection lens 306, moveable mirrors 307 and optical source 308 will be apparent to those skilled in the art (the configurations shown in FIGS. 1 and 2 may for example be used).

The detector 304 includes electronics which determine the centre of gravity of each hole 302. The centre of gravity of a given hole 302 is output by the detector 304 as being the position of that hole. Using the centre of gravity as the location of the hole means that it is not necessary that each of the holes 302 is the same size.

In use, during exposure of a first pattern onto the substrate 300, the locations of the holes 302 are measured by the detector 304, and are stored in the memory 311. No distortion adjustment of the pattern formed by the array of moveable mirrors 307 is performed.

Referring to FIG. 7 and FIG. 4, it can be seen that exposure of the substrate 300 is provided by a row of projection systems 31, 306 which extend in the x-direction across the substrate. The substrate 300 is scanned in the y-direction beneath the projection systems 31, 306 and the pattern provided on the array of movable mirrors 307 is continually updated, thereby applying a varying pattern onto the substrate. The direction of scanning movement of the substrate 300 is shown by an arrow 35, 312. The detector 304 is one of a multiplicity of detectors (shown schematically as detectors 34 in FIG. 4) located upstream of the projection systems 31, 306. This means that a given region of the substrate 300 will pass beneath the detectors 34, 304 before it passes beneath the projection systems 31, 306.

During exposure of a second pattern onto the substrate, the locations of the holes 302 are measured. The location of each hole 302 is compared by the comparator 310 with its previous position, as recorded in the memory 311. The comparator 310 generates an output which comprises an array of vectors indicating the location, direction, and extent of any distortion which has taken place, based upon measured differences between the locations of the holes 302. The control electronics 309 use the vectors to adjust the pattern projected by the array of moveable mirrors 307, so that it corresponds with the pattern already present on the substrate 300.

During subsequent exposures of further layers of patterns onto the substrate 300, the measured positions of the holes 302 are compared with the positions of the holes stored in the memory 311 during the first exposure, and distortion of the substrate 300 is determined accordingly.

Figure 9:
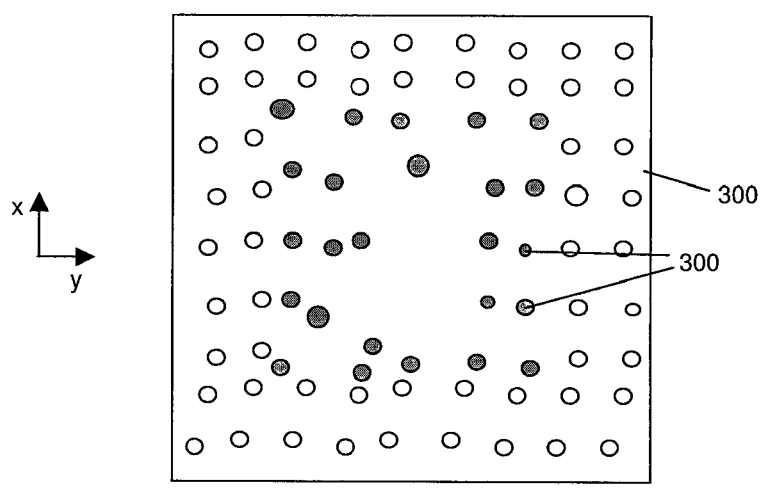

An example of a substrate 300 which has undergone distortion is shown in FIG. 9. It can be seen by comparing FIG. 9 with FIG. 8, that a central region of the substrate 300 has been distorted. Those holes 302 which have been moved by the distortion are shaded, so that they can be easily identified in the figure. Since the holes 302 are relatively small, typically 0.1 microns in diameter, they do not become substantially distorted when the substrate 300 is distorted, and so the centre of gravity of each hole (i.e. the centre point of each hole) is not substantially affected by the distortion of the substrate.

Figure 10:
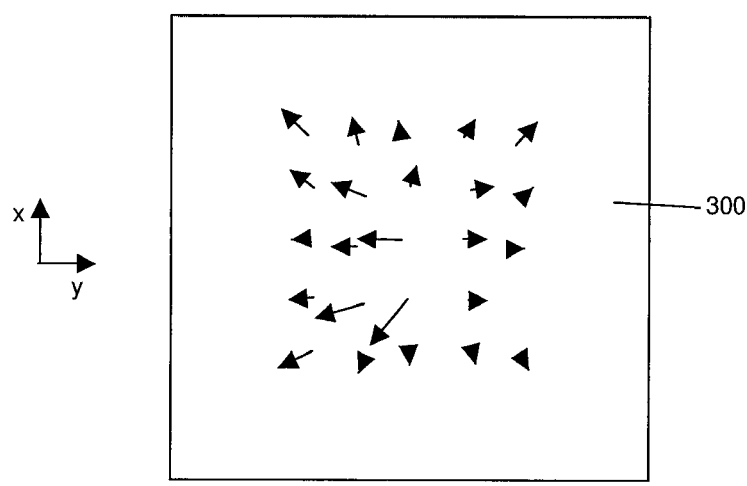

An example of a vector array, generated by comparing the positions of the holes in FIG. 9 with the positions of the holes in FIG. 8, is shown schematically in FIG. 10. The vectors, shown as arrows in FIG. 10, indicate that a central region of the substrate 300 has been stretched outwards. The pattern provided to the array of moveable mirrors 307 will be adjusted accordingly, by stretching the pattern outwards in the same manner.

It may be the case that following the projection of several layers of patterns onto the substrate that some of the holes 302 are no longer visible. When this occurs, distortion of the substrate 300 may be interpolated from the measured positions of adjacent holes 302.

Although the holes are shown as passing fully through the substrate 300 in FIG. 7, it will be appreciated that the holes may pass only part way through the substrate. An example of this is illustrated in FIG. 7b, in which holes 320 stop short of an upper surface of the substrate 300. Although the holes 320 are not open at a top surface of the substrate 300, they still allow light from the light source 303 to pass through the holes and be detected by the detector 304. In this sense the portions of substrate 300 which are located above the holes 320 is translucent.

Although in the embodiment of the invention illustrated in FIG. 7 the light source 303 is located beneath the substrate 300, and the detector 304 is located above the substrate, it will be appreciated that this arrangement is not essential. For example, the light source may be located above the substrate, with the detector being located beneath the substrate.

In the above described embodiments of the invention, the identity of a given substrate 99, 300 is recorded in the memory 125, 311 together with data describing that substrate (e.g. the sizes and locations of pits, the output from the servo, and/or the locations of holes). When an exposure of a pattern onto a substrate 99, 300 is to be performed, for a substrate which already bears one or more layers of patterns, the identity of the substrate is determined and this is used to retrieve the correct data from the memory 125, 311 for that substrate. The identity of the substrate 99, 300 may be determined from an identifying mark or other data which is read from the substrate. Alternatively, the identity of the substrate 99, 300 may be input to the lithographic apparatus from an outside source.

Although in above described embodiments of the invention, distortion of the substrate 99, 301, is measured immediately prior to exposure of a pattern onto the substrate, it will be appreciated that the distortion may be measured at an earlier stage. For example, distortion of the substrate 99, 300 may be measured in a dedicated measurement apparatus. Where this is done it is preferred that the substrate 99, 300 does not distort after the measurement. In general, distortion of the substrate 99, 300 occurs during chemical processing and baking of the substrate, and the substrate does not further distort after processing and baking has been completed. This means that distortion measurements obtained using the dedicated apparatus provide accurate distortion measurements which may be used at a later date to allow accurate lithographic projection of a pattern onto the substrate 99, 300.

Although in the above described embodiments of the invention the sizes and locations of the pits 105 or locations of the holes 302, 320 are measured during the first exposure onto the substrate 99, 300, it may be the case that such a measurement is not needed. For example, if it is known that the substrate 99, 300 only distorts during chemical processing and/or baking, then the form of the substrate may be unchanged following its manufacture (before the first exposure onto the substrate). A known pattern of pits 105 or holes 302, 320 may then be applied to the substrate during manufacture of the substrate 99, 300 and, since the pattern is known and has not changed, the pattern may be loaded directly into the memory 125, 311 from the manufacturer's data without measuring the pits or holes on the substrate. This stored pattern may then be used as the basis for determining distortion during exposure of layers subsequent to the first layer, in the manner described further above.

In an alternative application of the invention, an embodiment of the invention may be used to measure the sizes and locations of the pits 105 or locations of the holes 302, 320 following imprint of an array which is intended to have a known configuration. The measurements can then be compared with the intended configuration, thereby indicating the accuracy of the imprint process. This application of the invention may for example be used to measure the quality of apparatus used in imprint lithography.

The known pattern of pits 105 or holes 302, 320 applied to the substrate 99, 300 may comprise a regular pattern. For example, the pattern of pits 105 may comprise pits of equal length each being separated by a gap of the same length. In the absence of any distortion of the substrate 99, this would give rise to a detected signal comprising a square wave having a constant frequency. Any distortion of the substrate 99 would present itself as a deviation from the constant frequency. This arrangement is advantageous because it avoids the need for a large amount of manufacturer's data regarding locations and sizes of the pits 105. In addition, it avoids the requirement that the lithographic apparatus includes a memory 125 large enough to store the locations and sizes of all of the pits 105, and reduces the number of calculations which must be performed by the comparator 124. Although this example has been described in terms of pits 105 in the substrate, it will be appreciated that the example could also be applied to, e.g., holes 302, 320 in the substrate 300.

The term 'comparator' as used herein is not intended to be interpreted as being limited to an electronics device which compares two voltages or currents then switches an output, but instead is intended to be interpreted more generally as meaning an apparatus which compares two sets of data (where data can include previously stored information or contemporaneously obtained information).

Although the embodiments of the invention have been described in terms of pits or holes provided in the substrate 99, 301, it will be appreciated that it may be possible to use other forms of marks on the substrate. For example, dots may be printed onto, or etched into, a lowermost surface of the substrate. These marks may be detected using suitable optical detectors, as will be apparent to those skilled in the art. The dots might be printed onto the substrate for example using imprint lithography. In an embodiment, the substrate comprises at least 1000 marks, e.g. at least 10000 marks, at least 100000 marks, at least 1000000 marks, or at least 10000000 marks.

The described embodiments of the invention refer to arrays of pits 105 or holes 302, generally set out in a plurality of rows or in a two dimensional grid. It will be appreciated however, that alternative arrangements of the pits or holes may be provided. For example, a single row of pits may be arranged in a spiral on the substrate, the spiral passing from the centre of the substrate to the perimeter of the substrate, so that only one laser and associated detector is required to measure the pits or holes. This may be particularly appropriate if the substrate is round (for example the substrate may have the shape of a conventional lithographic wafer). Where this is done, the servo upon which the laser and detector are mounted may have a long range of travel, to allow the spiral to be tracked from an outer rim of the substrate to a central point of the substrate.

Although the described embodiments of the invention use an array of moveable mirrors to project a pattern onto the substrate, it will be appreciated that an array of adjustable elements other than mirrors may be used. Furthermore, it may also be possible to correct the distortion of the substrate by, e.g., using a lens system to distort a pattern provided on a mask.

Although the described embodiments of the invention relate to scanning a substrate over lasers and associated detectors, it will be appreciated that it is also possible to scan the lasers and associated detectors under the substrate. In either case, the relative movement of the substrate and lasers (and associated detectors) allows the distortion of the substrate to be measured. Scanning of the lasers and associated detectors may be achieved for example by mounting them on one or more servos with a range of motion that is equal to or greater than the length of the substrate.

Although specific reference may have been made in this text to the use of lithographic apparatus in the manufacture of a specific device (e.g. an integrated circuit or a flat panel display), it should be understood that the lithographic apparatus described herein may have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), etc. Also, for instance in a flat panel display, the present apparatus may be used to assist in the creation of a variety of layers, e.g. a thin film transistor layer and/or a color filter layer.

Although specific reference may have been made above to the use of embodiments of the invention in the context of optical lithography, it will be appreciated that the invention may be used in other applications, for example imprint lithography, where the context allows, and is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Although specific embodiments of the invention have been described in relation to lithographic substrates, it will be appreciated that the invention may be applied to substrates used for purposes other than lithography.

While specific embodiments of the invention have been described above, it will be appreciated that the invention may be practiced otherwise than as described. For example, where appropriate, the invention may take the form of a computer program containing one or more sequences of machine-readable instructions describing a method as disclosed above, or a data storage medium (e.g. semiconductor memory, magnetic or optical disk) having such a computer program stored therein.

Having described specific embodiments of the present invention, it will be understood that many modifications thereof will readily appear or may be suggested to those skilled in the art, and it is intended therefore that this invention is limited only by the spirit and scope of the following claims.

What is claimed is:

1. A substrate comprising:
   a photosensitive layer;
   a mark layer arranged below the photosensitive layer and having at least 1000 marks, and
   a reflective layer arranged between the mark layer and the photosensitive layer so as to fill spaces between the marks, said reflective layer being reflective to a radiation beam of a first wavelength,
   wherein said mark layer is transmissive to the radiation beam at said first wavelength so that said radiation beam propagating through said mark layer is reflected by said reflective layer, and
   wherein said substrate is a polygonal substrate and wherein at least one side of the polygonal substrate has a length of at least 50 cm.

2. The substrate of claim 1, wherein said photosensitive layer is a resist layer.

3. The substrate of claim 1, wherein said marks face away from said photosensitive layer.

4. The substrate of claim 1, wherein said substrate comprises a plastic layer.

5. The substrate of claim 1, wherein said mark layer comprises at least 1000000 marks.

6. The substrate of claim 1, wherein said marks include pits.

7. The substrate of claim 1, wherein said marks are arranged in rows.

8. The substrate of claim 1, wherein the marks are of equal length and are separated by a gap of equal length.

9. The substrate of claim 1, wherein the mark layer is between the photosensitive layer and a base layer forming the substrate.

10. The substrate of claim 1, wherein the mark layer including the marks is transparent to visible radiation.

11. A substrate comprising:
    a photosensitive layer;
    a mark layer arranged below the photosensitive layer and having at least 1000 marks,
    a reflective layer arranged between the mark layer and the photosensitive layer,
    wherein the reflective layer is configured to reflect a beam of light to be used to illuminate a first side of the substrate that is opposite a second side of the substrate on which said photosensitive layer is arranged, and
    wherein the marks form an array of pits on a surface of the mark layer facing the reflective layer, and
    wherein the reflective layer is arranged on the mark layer so as to cover each of said marks and fill spaces between the marks.

12. The substrate of claim 11, wherein the mark layer including the marks is transparent to visible radiation.

13. The substrate of claim 11, comprising a base layer, wherein the mark layer is arranged between the base layer and the reflective layer, said base layer being transparent at a radiation wavelength and said reflective layer being opaque at said radiation wavelength.

14. The substrate of claim 13, wherein the base layer is made of a material selected from the group consisting of polycarbonate, quartz, glass and silicon dioxide.

15. The substrate of claim 11, wherein the mark layer is constructed and arranged to provide distortion information of said substrate.

* * * * *